United States Patent [19]

Teong

[11] Patent Number: 5,693,563
[45] Date of Patent: Dec. 2, 1997

[54] ETCH STOP FOR COPPER DAMASCENE PROCESS

[75] Inventor: Su-Ping Teong, Singapore, Singapore

[73] Assignee: Chartered Semiconductor Manufacturing Pte Ltd., Singapore, Singapore

[21] Appl. No.: 679,973

[22] Filed: Jul. 15, 1996

[51] Int. Cl.⁶ .................................................. H01L 21/44
[52] U.S. Cl. .................................................. 437/190; 437/195
[58] Field of Search .................................................. 437/190, 195, 437/198; 257/758

[56] References Cited

U.S. PATENT DOCUMENTS

| | | | |
|---|---|---|---|
| 4,910,169 | 3/1990 | Hoshino | 437/198 |
| 4,931,410 | 6/1990 | Tokunaga et al. | 437/189 |
| 5,084,412 | 1/1992 | Nakasaki | 437/189 |
| 5,141,897 | 8/1992 | Manocha | 437/228 |
| 5,354,712 | 10/1994 | Ho et al. | 437/195 |
| 5,447,599 | 9/1995 | Li et al. | 216/17 |
| 5,447,887 | 9/1995 | Filipiak et al. | 437/200 |
| 5,602,053 | 2/1997 | Zheng | 437/60 |
| 5,612,254 | 3/1997 | Mu | 437/195 |
| 5,635,423 | 6/1997 | Huang | 437/195 |

*Primary Examiner*—John Niebling
*Assistant Examiner*—Brendan Mee
*Attorney, Agent, or Firm*—George O. Saile; Stephen B. Ackerman

[57] ABSTRACT

The invention describes the application of copper damascene connectors to a double level metal process. A dual damascene copper connector whose upper surface is coplanar with the upper surface of the insulating layer in which it is embedded is described. Out-diffusion of copper from the connector is prevented by at least two barrier layers. One or two barrier layers are located at the interface between the connector and the insulating layer while another barrier layer comprises conductive material and covers the upper surface of the connector. When a second damascene connector is formed above the first connector the conductive barrier layer facilitates good contact between the two connectors. It also acts as an etch stop layer during the formation of the second connector. A process for manufacturing this structure is also described. It involves over-filling a trench in the surface of the insulator with copper and then removing the excess by chem.-mech. polishing.

7 Claims, 3 Drawing Sheets

ETCH STOP FOR COPPER DAMASCENE PROCESS

BACKGROUND OF THE INVENTION (1) Field of the Invention

The invention relates to the general field of integrated circuits, more particularly to the formation of copper interconnections therein.

(2) Description of the Prior Art

As wire widths in integrated circuits continue to shrink, the electrical conductivity of the wiring material itself becomes increasingly more important. Thus, in this regard, aluminum, which has been the material of choice since the integrated circuit art began, is becoming less attractive than other better conductors such as copper, gold, and silver. These materials, in addition to their superior electrical conductivity, are also more resistant than aluminum to electromigration, a quality that grows in importance as wire widths decrease.

The metals in question have not been widely used for wiring as yet because they also suffer from a number of disadvantages, including formation of undesirable intermetallic alloys and/or recombination centers in other parts of the integrated circuit and they often have high diffusion rates. Copper has the additional disadvantage of being readily oxidized at relatively low temperatures. Nevertheless, copper is seen as an attractive replacement for aluminum because of its low cost and ease of processing so that the prior and current art has tended to concentrate on finding ways to overcome these limitations.

A particular problem related to copper's high susceptibility to oxidation is that conventional photoresist processing cannot be used when the copper is to be patterned into various wire shapes because the photoresist needs to be removed at the end of the process by heating it in a highly oxidizing environment, such as an oxygen plasma, thereby converting it to an easily removed ash.

Several solutions to the above problems associated with copper processing have been proposed in the prior art. Hoshino (U.S. Pat. No. 4,910,169 March 1990) teaches the use of low temperature deposition techniques, such as RF sputtering, for coating copper layers with materials such as silicon oxide, silicon nitride, and phosphosilicate glass. It should be noted that the materials mentioned were for the purpose of forming inter-metal dielectric layers rather than for use as barrier layers, implying that they were relatively thick.

Li et al. (U.S. Pat. No. 5,447,599 September 1995) use TiN(O) as a barrier layer material for copper. The copper is initially coated with a layer of titanium and a copper-titanium alloy is formed by heating at 3°–400° C. Unreacted titanium is then removed and the alloy is transformed to TiN(O) by means of a rapid thermal anneal in ammonia and oxygen.

Nakasaki (U.S. Pat. No. 5,084,412 January 1992) underlays the copper layer with a metallic nitride and then heats the combination in nitrogen to bring about grain boundary diffusion of the nitrogen into the copper. This results in a material having relatively low electrical resistivity together with good resistance to electromigration.

Tokunaga et al. (U.S. Pat. No. 4,931,410 June 1990) use photoresist for shaping their copper but first protect it with an anti-oxidizing layer. Etching is then performed in two steps—first the anti-oxidizing layer is etched in conventional fashion, including photoresist removal, following which said anti-oxidizing layer is used as the mask for the etching of the copper.

Filipiak et al. (U.S. Pat. No. 5,447,887 September 1995) use an intermediate layer of copper silicide to improve the adhesion between a copper layer and a silicon nitride layer.

It should be noted that none of the above-cited examples of the prior art is based on a damascene process. The term 'damascene' is derived from a form of inlaid metal jewelery first seen in the city of Damascus. In the context of integrated circuits it implies a patterned layer imbedded on and in another layer such that the top surfaces of the two layers are coplanar.

Ho et al. (U.S. Pat. No. 5,354,712 October 1994) do teach the use of the damascene process for forming interconnections, including the use of copper together with barrier layers (as discussed above). Ho's teachings are limited to single level metal processes. In particular, Ho et al. do not show (as does the present invention) that, in a double metal process, the barrier layer can also be used as an etch stop layer, thereby simplifying the overall manufacturing process.

SUMMARY OF THE INVENTION

It has been an object of the present invention to provide copper connectors as part of double level metal processes in an integrated circuit.

Another object of the present invention has been to provide an etch stop layer that simplifies the formation of said copper connectors.

A further object of the present invention has been to provide means for preventing the outdiffusion of copper from said connector into adjoining layers.

Yet another object of the present invention has been to provide a method for manufacturing said copper connector that achieves the above objects simultaneously in an efficient manner.

These objects have been achieved by providing a dual damascene copper connector whose upper surface is coplanar with the upper surface of the insulating layer in which it is embedded. Out-diffusion of copper from the connector is prevented by at least two barrier layers. One or two barrier layers are located at the interface between the connector and the insulating layer while another barrier layer comprises conductive material and covers the upper surface of the connector. When a second damascene connector is formed above the first connector, as in double layer metallization, the conductive barrier layer facilitates good contact between the two connectors. It also acts as an etch stop layer during the formation of the second connector. The process for manufacturing this structure is also described. It involves over-filling a trench in the surface of the insulator with copper and then removing the excess by chem.-mech. polishing.

DESCRIPTION OF THE PREFERRED EMBODIMENTS

Figure 1:
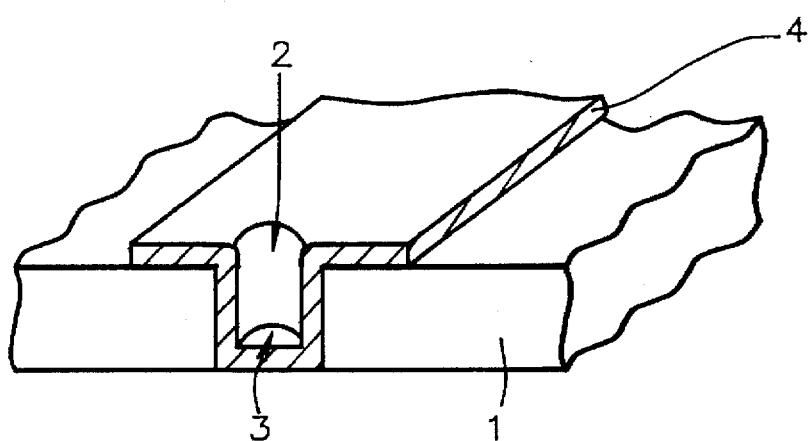
FIGS. 1 through 4 illustrate the process of the present invention used for manufacturing a dual damascene connector in single level metallurgy.

Referring now to FIG. 1 we begin a description of the dual damascene process. Insulating layer 1 has been deposited onto the upper surface of a partially completed integrated circuit (not shown). Cavity 2 has been etched all the way through layer 1. It is shown as cylindrical in cross-section, but any shape (such as rectangular) could be used. Barrier layer 4 has been deposited to line the walls of cavity 3 and has also been extended outwards from the rim of the cavity for some distance along the top surface of 1.

Figure 2:
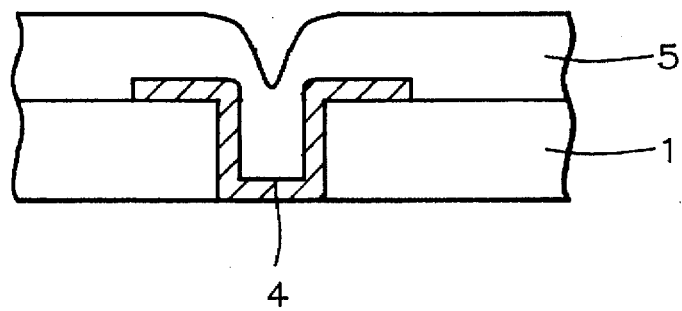
Figure 3:
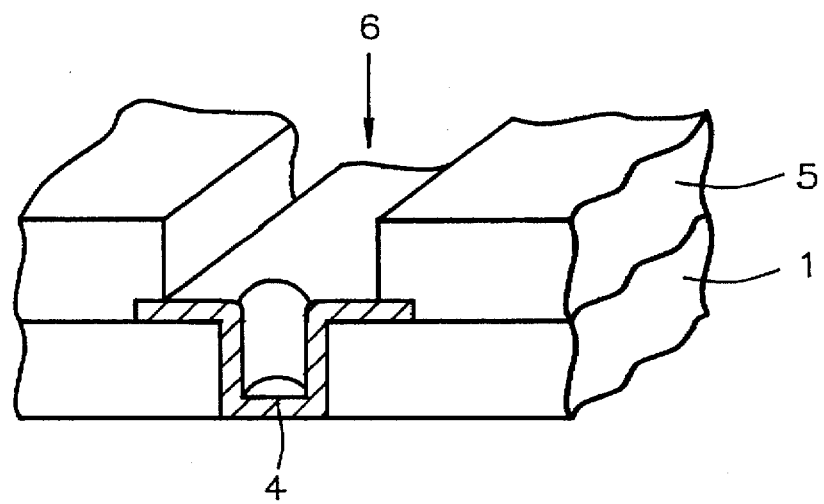

Insulating layer 5 is then deposited over the structure (as shown in FIG. 2) following which trench 6 is formed by etching all the way through layer 5. Trench 6 is narrower than the extension of barrier layer 4. This allows etching to proceed until cavity 2 has been re-formed without any danger of the etchant attacking layer 1 since layer 4 acts as an etch stop. This is illustrated in FIG. 3.

Figure 4:
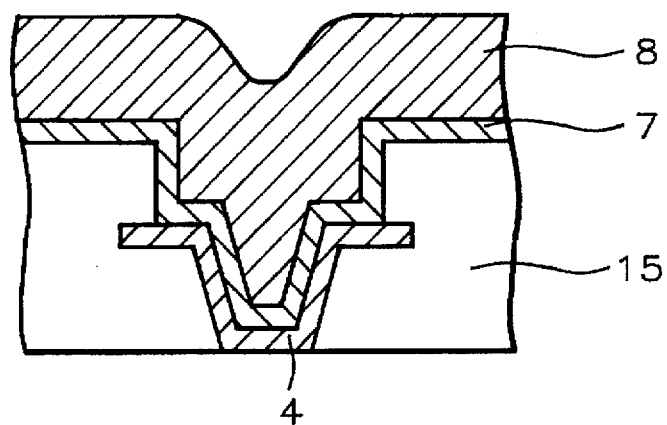

Referring now to FIG. 4, a second barrier layer 7 is deposited so as to coat the walls of both cavity 2 and trench 6. Layer 7 also covers the surface of layer 15 (which is the insulating layer resulting from the superposition of layer 5 over layer 1). It should also be noted that in some processes of the prior art, where an etch stopping layer is not utilized, layer 4 is absent and layer 7 alone serves as the barrier layer. Copper layer 8 is now deposited over the structure in sufficient quantity to ensure that cavity 2 is more than filled.

Using a suitable method such as chemical-mechanical polishing, layer 8 is now removed down to the level of the horizontal portion of layer 7 which is also removed. This completes the dual damascene process as practiced in the prior art.

Figure 5A:
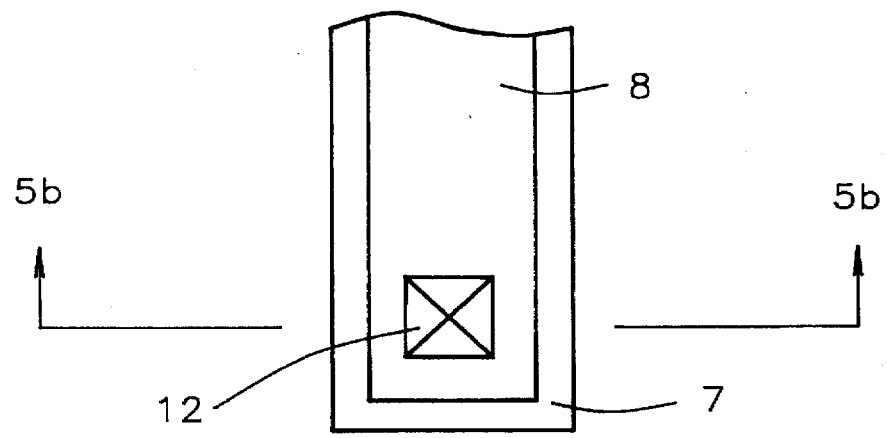
FIG. 5a is a plan view of the cross-section shown in FIG. 5b.
Figure 5B:
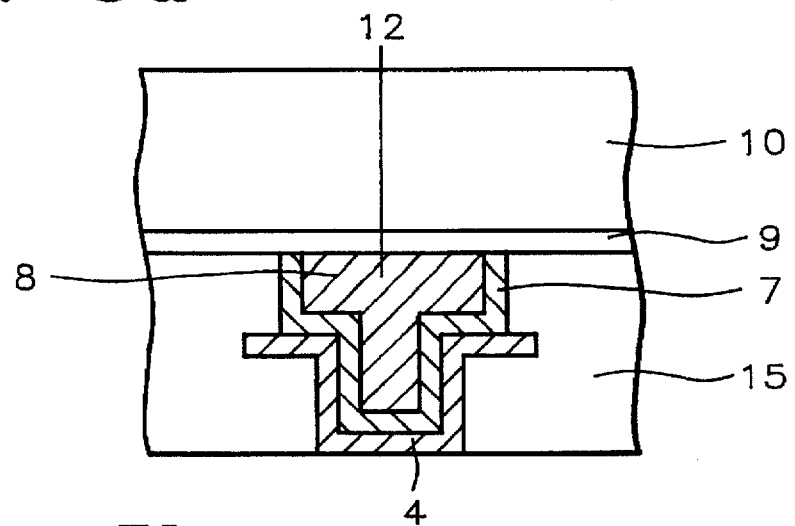
FIG. 5b shows a dual damascene connector that includes an insulator as a barrier layer across the entire upper surface.
Figure 6:
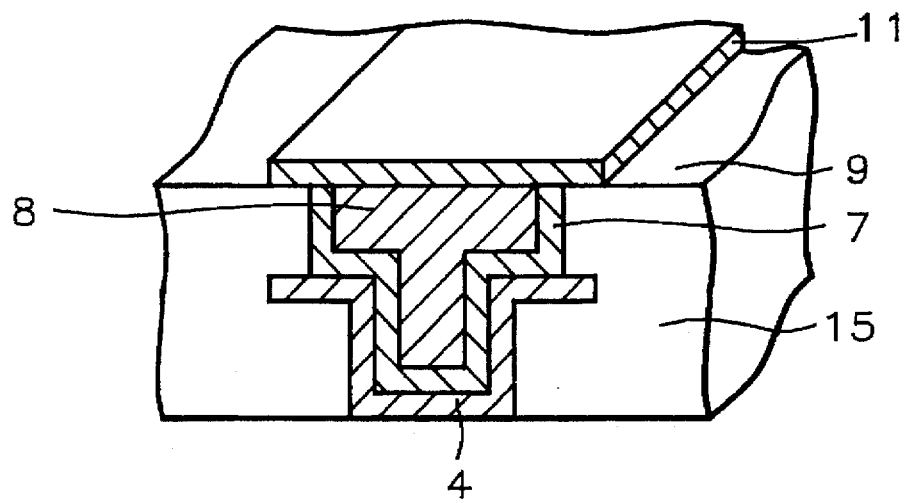
FIG. 6 shows a dual damascene copper connector according to the design of the present invention.

Referring now to FIG. 6, barrier layer 11 can be seen to have replaced barrier layer 9 of FIG. 5b. Instead of covering the entire surface, layer 9 has been patterned and etched so that it is limited to just overlapping the trench part 8 of the damascene connector. By thus limiting the extent of the barrier layer it becomes possible to use a conductive material such as titanium nitride. The importance of this will become clear shortly.

Figure 7:
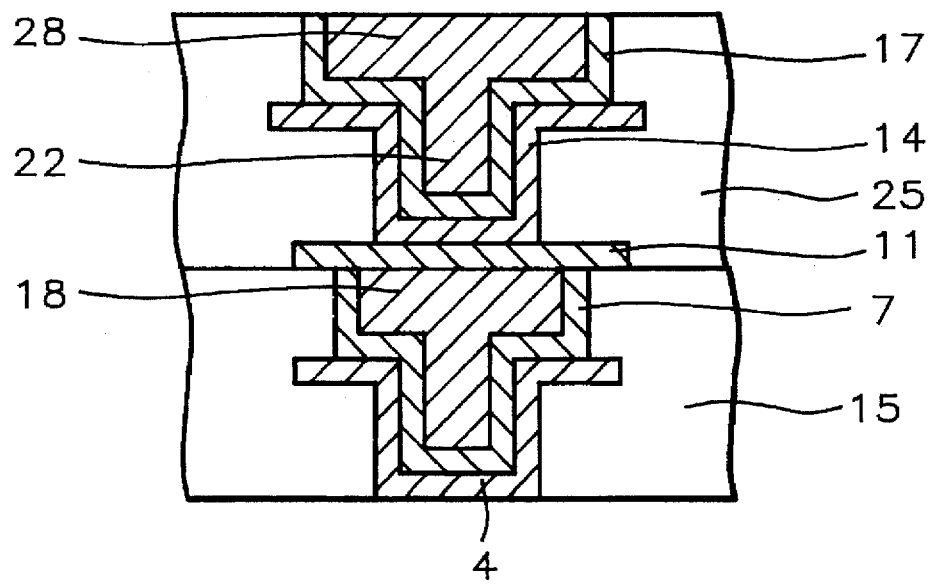
FIG. 7 shows how the design of FIG. 6 is used to simplify the application of dual damascene connectors to double level metallurgy.

FIG. 7 illustrates a key feature of the present invention, namely the application of copper damascene connectors to a double level metal process. Under these conditions, two such connectors are needed. Upper damascene connector 28 is embedded in upper insulating layer 25 in the same way that lower damascene connector 18 is embedded in insulating layer 15. If barrier layer 11 had comprised an insulating material it would have been necessary to remove it in the region where the upper and lower damascene connectors need to make contact. By replacing unpatterned insulating layer 9 (FIG. 5b) by patterned conducting layer 11 (FIGS. 6 and 7), this step is no longer needed. Layer 11 is the top seal for copper metal 18. It is needed because all copper lines must be completely surrounded by barrier material. Layer 14 serves as the etch stop layer when the opening (that will later be filled by copper 28) is being etched out.

Referring once again to FIG. 1, the process for manufacturing the present invention begins with the provision of a partially completed integrated circuit (not shown here). Insulating layer 1, comprising silicon oxide is then deposited to a thickness between about 3,000 and 6,000 Angstroms onto the integrated circuit by Chemical Vapor Deposition (CVD). Layer 1 is then patterned and etched to form cavity 2 extending down to the surface of the integrated circuit where contact is to be made to a diffusion or polysilcon area 3. Cavity 2 may be rectangular in cross-section (measuring between about 0.5 and 3 microns on a side) or circular (with a diameter between about 0.5 and 3 microns.

Next, barrier layer 4, comprising titanium and titanium nitride or pure titanium nitride, is deposited to a thickness between about 500 and 1500 Angstroms on the walls of cavity 2 as well as on the upper surface of insulating layer 1, following which it is patterned and etched so that it extends for a short distance beyond the rim of cavity 2 on the top surface of 1. We have preferred to make this extension about equal to cavity 2's width (for a rectangular cavity), or diameter (for a circular cavity) but any value between about 0.1 and 0.5 microns would still work.

Referring to FIG. 2, insulating layer 5, comprising silicon oxide is now deposited, to a thickness between about 2,000 and 6,000 Angstroms, onto the upper surface of layer 1 which is then patterned and etched to form a trench 6, as shown in FIG. 3. Said trench is narrower than layer 4 but wider than cavity 2. Its depth is between about 2,000 and 6,000 Angstroms. As shown, it is symmetrically disposed above cavity 2.

Moving on to FIG. 4, second barrier layer 7, comprising titanium nitride, is now deposited, to a thickness between about 500 and 2,000 Angstroms, so as to coat the walls of both trench 6 and cavity 2 as well as the upper surface of insulating layer 15. This is followed by the deposition of copper layer 8 by vacuum evaporation or CVD to a thickness that is sufficient to more than fill both the cavity and the trench. Layer 8 is now removed by some suitable method, such as chemical-mechanical polishing, until the top surface of the connector is flush with the top surface of insulating layer 15. That is, that portion of layer 7 that lies on 15 is also removed.

As an additional step to the above described process, barrier layer 9 (see FIG. 5b), consisting of silicon nitride, is then deposited over the entire structure following which passivation layer 10, consisting of silicon oxide or silicon nitride or a combination of silicon oxide and nitride or polyimide, is deposited over it. FIG. 5a is a plan view of the cross-section shown in FIG. 5b. Layer 9 extends over the entire structure and is therefore restricted to being an insulating material. The structure illustrated in FIG. 5b is the subject of a patent application (CS-95-049) currently pending before the PTO.

Referring now to FIG. 6, etch stop layer 11, comprising titanium nitride, is deposited to a thickness between about 500 and 2,000 Angstroms onto layer 15 and connector 8, following which it is patterned and etched so that it slightly overlaps the upper surface of damascene connector 18. Together with the deposition (in two stages) of insulating layer 25 (FIG. 7), second damascene connector 28 is then formed in the same manner as just described for connector 18, with layer 11 acting as the copper sealing layer and layer 14 acting as the etch stop layer during the formation of cavity 22. Since layer 11 comprises conductive material, it does not introduce significant contact resistance between the upper and lower damascene connectors.

It should be noted that although FIG. 7 shows the two copper vias as stacked directly one on top of the other, they do not have to necessarily be so arranged for the process of the present invention to still work.

While the invention has been particularly shown and described with reference to the preferred embodiments thereof, it will be understood by those skilled in the art that various changes in form and details may be made without departing from the spirit and scope of the invention.

What is claimed is:

1. A method for manufacturing a double layered copper connector comprising:

(a) providing a partially completed integrated circuit;

(b) depositing a first insulating layer, having an upper surface, on said integrated circuit;

(c) patterning and then etching said first insulating layer to form a cavity extending down to the level of said integrated circuit;

(d) depositing a first barrier layer on the walls of said cavity and on the upper surface said first insulating layer;

(e) patterning and etching said first barrier layer so that it extends for some distance, on the upper surface of said first insulating layer, on all sides of the cavity;

(f) depositing a second insulating layer, having upper and lower surfaces, on the upper surface of said first insulating layer;

(g) patterning and then etching said second insulating layer to form a trench therein, said trench being narrower than said extension of the first barrier layer, wider than said cavity, and symmetrically disposed over said cavity;

(h) depositing a second barrier layer on the walls of both the trench and the cavity and on the upper surface of said second insulating layer;

(i) depositing a copper layer to more than fill said cavity and said trench;

(j) removing said copper layer and said second barrier layer to the level of the upper surface of said second insulating layer, thereby forming a first dual damscene copper connector having an upper surface;

(k) depositing an etch stop barrier layer on the upper surface of the second insulating layer and on the upper surface of said damascene connector;

(l) patterning and etching said etch stop barrier layer so that it slightly overlaps said upper surface of said damascene connector; and (m) forming a second dual damascene connector, disposed directly above the first dual damascene connector, in the manner recited in steps (b) through (j) above.

2. The method of claim 1 wherein the method for removing said copper layer comprises chemical-mechanical polishing.

3. The method of claim 1 wherein the method for depositing said copper layer comprises vacuum evaporation or chemical vapor deposition.

4. The method of claim 1 wherein said first barrier layer is deposited to a thickness between about 500 and 2,000 Angstroms.

5. The method of claim 1 wherein said second barrier layer is deposited to a thickness between about 500 and 2,000 Angstroms.

6. The method of claim 1 wherein said etch stop barrier layer is deposited to a thickness between about 500 and 1,500 Angstroms.

7. The method of claim 1 wherein the distance that the first barrier layer extends on the upper surface of the first insulating layer is between about 0.1 and 0.5 microns.

* * * * *